United States Patent [19]

Nissly et al.

[11] Patent Number: 4,939,491
[45] Date of Patent: Jul. 3, 1990

[54] COMBINATION BARRIER AND AUXILIARY CT BOARD

[75] Inventors: Gregg J. Nissly, Greentree; Alan B. Shimp, Monroeville; Lance Gula, Aliquippa, all of Pa.

[73] Assignee: Westinghouse Electric Corp., Pittsburgh, Pa.

[21] Appl. No.: 428,430

[22] Filed: Oct. 26, 1989

Related U.S. Application Data

[63] Continuation of Ser. No. 226,655, Aug. 1, 1988, abandoned.

[51] Int. Cl.$^5$ ............................................. H01H 83/02
[52] U.S. Cl. ...................................... 335/18; 200/292; 200/306; 361/115; 361/395; 336/65
[58] Field of Search .................. 361/1, 114, 115, 360, 361/370, 379, 380, 381, 383, 395, 400, 404, 405, 419; 200/144 R, 306, 292; 335/6, 18; 336/65, 90, 105

[56] References Cited

U.S. PATENT DOCUMENTS

| | | | |
|---|---|---|---|
| 3,848,207 | 11/1974 | Bussey | 361/405 |
| 4,038,618 | 7/1977 | Gryctko | 361/115 |
| 4,046,975 | 9/1977 | Seeger, Jr. | 200/306 |
| 4,247,840 | 1/1981 | Cooper | 335/18 |
| 4,281,359 | 7/1981 | Bayer | 335/18 |
| 4,489,295 | 12/1984 | Altenhof, Jr. et al. | 335/20 |
| 4,508,942 | 4/1985 | Inaba | 200/306 |
| 4,549,242 | 10/1985 | Nebon | 200/306 |
| 4,638,277 | 1/1987 | Thomas et al. | 335/190 |
| 4,652,975 | 3/1987 | Scott | 361/400 |
| 4,656,444 | 4/1987 | McKee et al. | 335/16 |
| 4,679,018 | 7/1987 | McKee et al. | 335/167 |
| 4,712,160 | 12/1987 | Sato | 361/395 |

FOREIGN PATENT DOCUMENTS 80551 4/1977 Australia ............................ 200/306

Primary Examiner—Gerald P. Tolin
Attorney, Agent, or Firm—M. J. Moran

[57] ABSTRACT

A multipurpose combination barrier and auxiliary current transformer board is provided for a circuit breaker. The board is located at the rear of the circuit breaker housing to close an open portion of the housing and act as a barrier to prevent contact with internal circuit breaker components. Vent holes, provided in the bottom portion of the board, allow heat generated within the circuit breaker to be exhausted to the atmosphere. The top portion of the board serves as a mounting plate for the auxiliary current transformers. The top portion of the board is formed from a printed circuit board having an electric circuit disposed thereon for the connections between the main current transformers, auxiliary transformers and the electronic trip unit. Connectors are provided on the printed circuit board adjacent each auxiliary current transformer to connect the main current transformers to the printed circuit. Another connector is provided on the board to connect the printed circuit board to the electronic trip unit. Thus, time consuming wiring connections are greatly reduced.

2 Claims, 7 Drawing Sheets

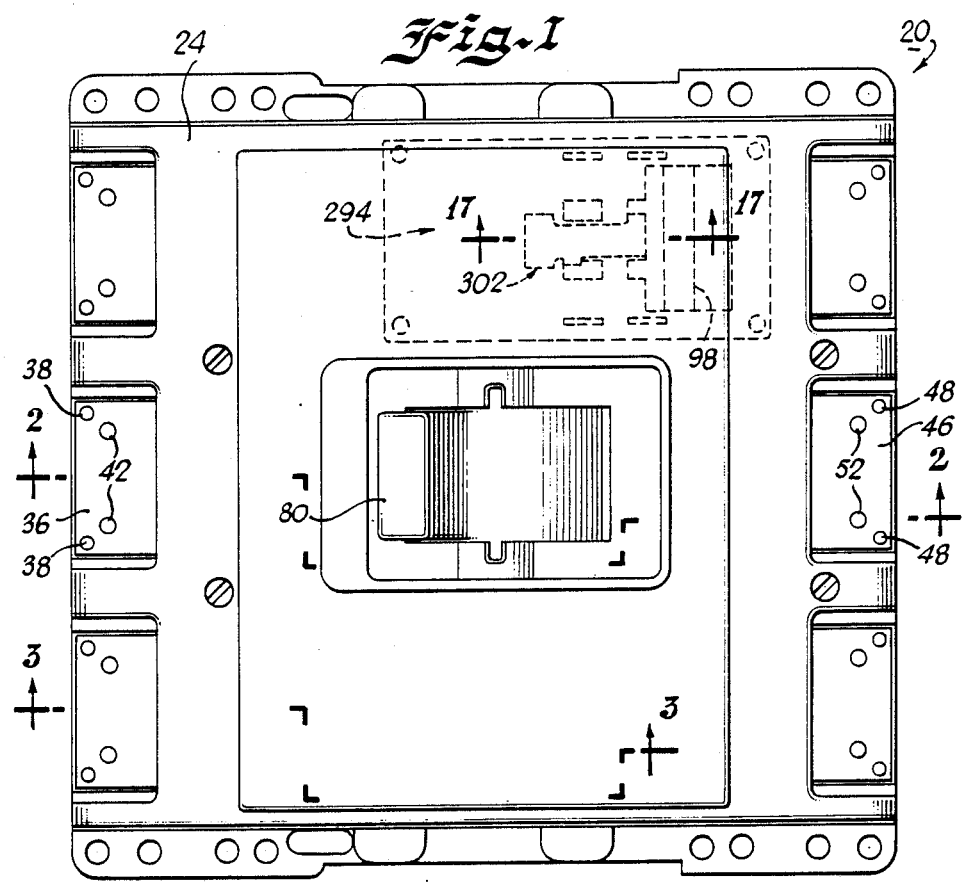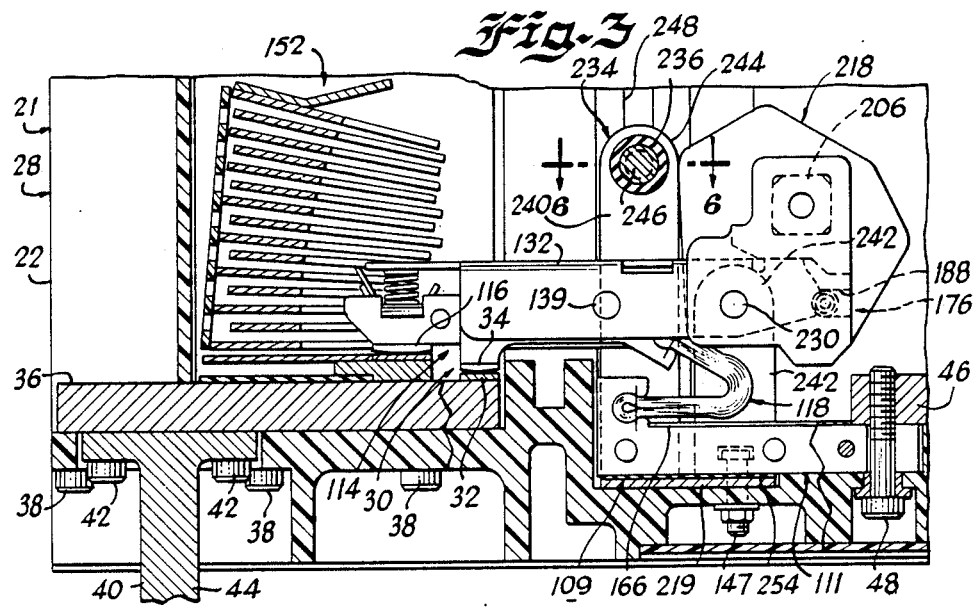

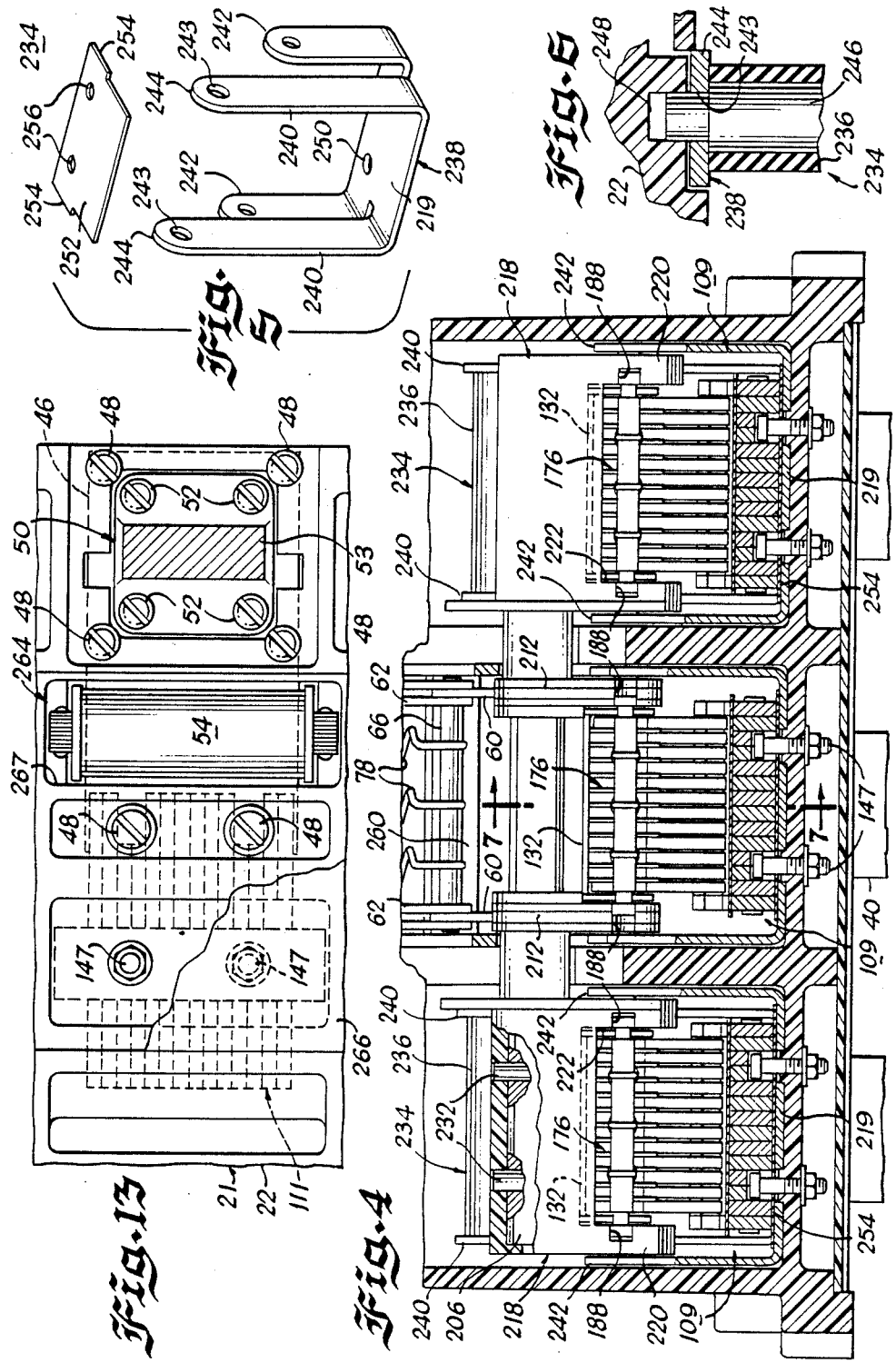

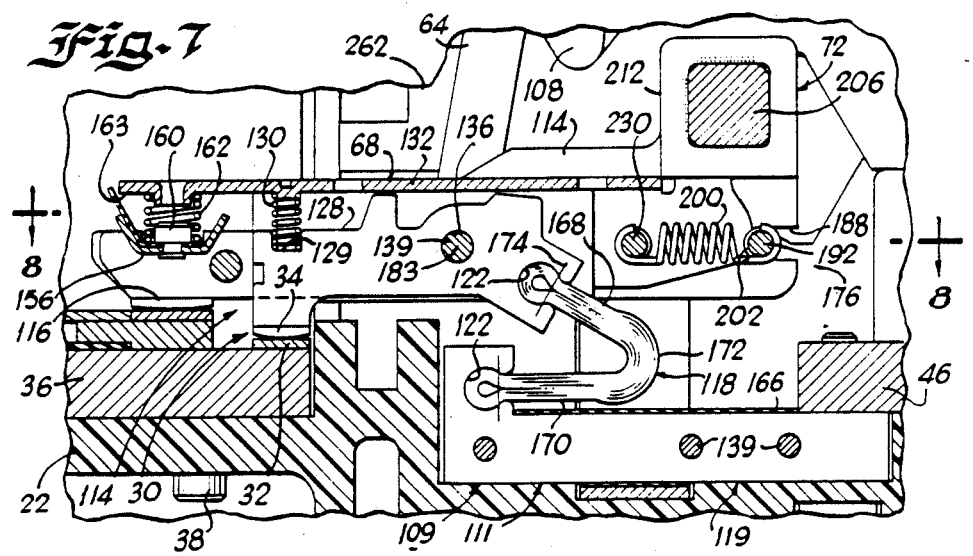
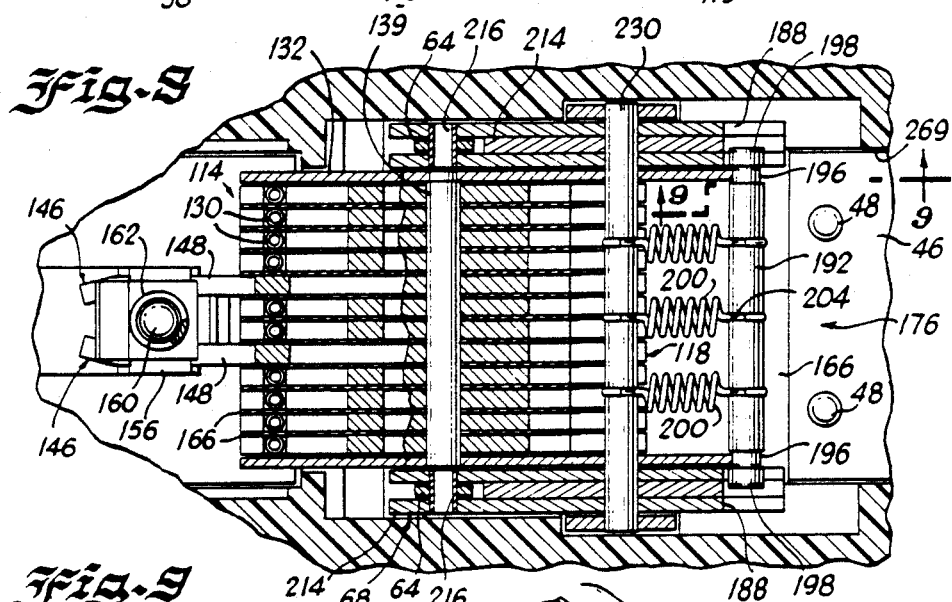
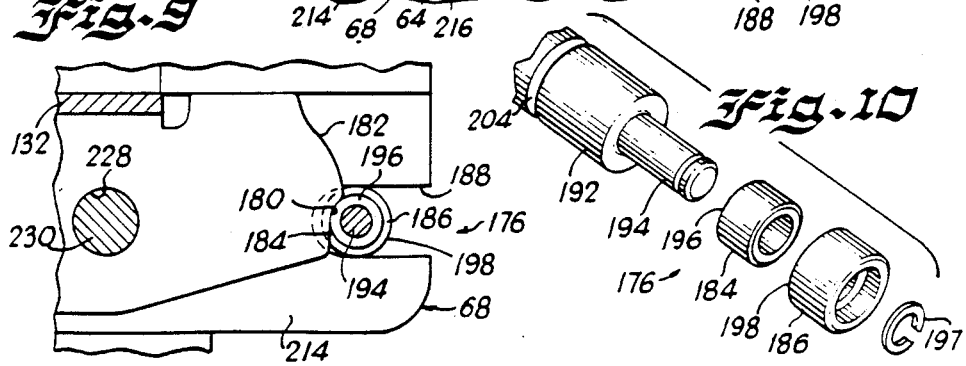

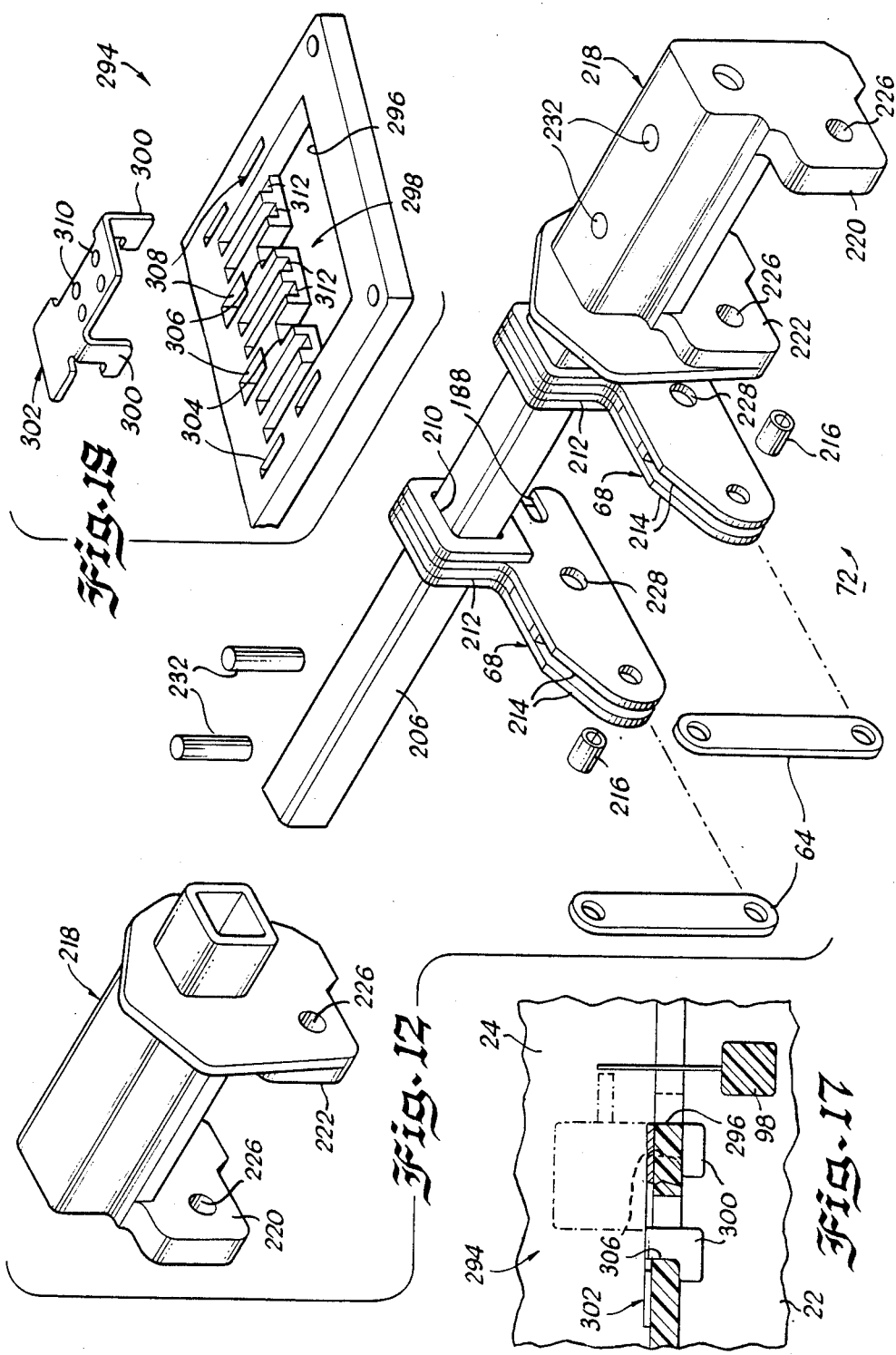

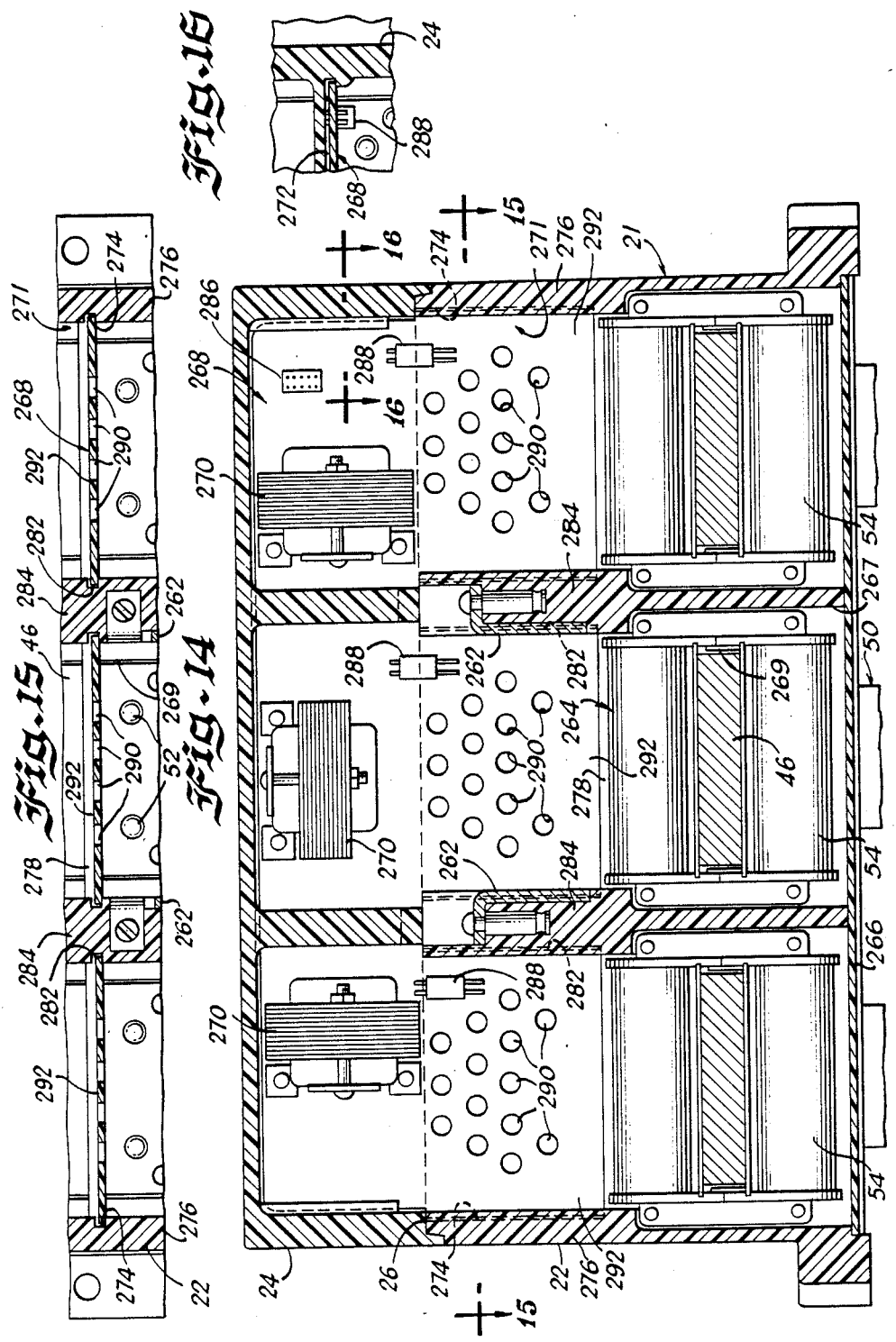

COMBINATION BARRIER AND AUXILIARY CT BOARD

This application is a continuation-in-part of application Ser. No. 07/226,655 filed Aug. 1, 1988, now abandoned.

CROSS-REFERENCE TO RELATED APPLICATIONS

This application is related to the following copending applications, all filed on Aug. 1, 1988; Ser. No. 07/226,500, entitled RUBBER STOPS IN OUTSIDE POLES, by William E. Beatty Jr., Lawrence J. Kapples, Lance Gula and Joseph F. Changle, Westinghouse Case No. WE 54,532; Ser. No. 07/226,648, entitled CT QUICK CHANGE ASSEMBLY, by Jere L. McKee, William E. Beatty Jr. and Glenn R. Thomas, Westinghouse Case No. WE 54,533; Ser. No. 07/226,503, entitled CROSSBAR ASSEMBLY, by Jere L. McKee, Lance Gula and Glenn R. Thomas, Westinghouse Case No. WE 54,579; Ser. No. 07/226,649, entitled LAMINATED COPPER ASSEMBLY, by Charles L. Paton, Westinghouse Case No. WE 54,580; Ser. No. 07/226,650, entitled CROSSBAR ASSEMBLY, by Lance Gula and Jere L. McKee, Westinghouse Case No. WE 54,594 and Ser. No. 07/226,654, entitled MODULAR OPTION DECK ASSEMBLY, by Andrew J. Male, Westinghouse Case No. WE 54,822.

BACKGROUND OF THE INVENTION

1. Field of the Invention

This invention relates to molded case circuit breakers and more particularly to a multipurpose combination barrier and auxiliary current transformer board for mounting auxiliary current transformers and providing electrical circuit connections between main current transformers, auxiliary transformers and an electronic trip unit. The board also acts as a barrier to prevent contact with components within the circuit breaker housing. Venting poles are provided on the board to allow heat generated inside the circuit breaker to be exhausted to the atmosphere.

2. Description of the Prior Art

Molded case circuit breakers are generally old and well known in the art. Examples of such circuit breakers are disclosed in U.S. Pat. Nos. 4,489,295; 4,638,277; 4,656,444 and 4,679,018. Such circuit breakers are used to protect electrical circuitry from damage due to an overcurrent condition, such as an overload and relatively high level short circuit. An overload condition is about 200–300% of the nominal current rating of the circuit breaker. A high level short circuit condition can be 1000% or more of the nominal current rating of the circuit breaker.

Molded case circuit breakers include at least one pair of separable contacts which may be operated either manually by way of a handle disposed on the outside of the case or automatically in response to an overcurrent condition. In the automatic mode of operation the contacts may be opened by an operating mechanism or by a magnetic repulsion member. The magnetic repulsion member causes the contacts to separate under relatively high level short circuit conditions. More particularly, the magnetic repulsion member is connected between a pivotally mounted contact arm and a stationary conductor. The magnetic repulsion member is a generally V-shaped member defining two legs. During high level short circuit conditions, magnetic repulsion forces are generated between the legs of the magnetic repulsion member as a result of the current flowing therethrough which, in turn, causes the pivotally mounted contact arm to open.

In a multipole circuit breaker, such as a three-pole circuit breaker, three separate contact assemblies having magnetic repulsion members are provided; one for each pole. The contact arm assemblies are operated independently by the magnetic repulsion members. For example, for a high level short circuit on the A phase, only the A phase contacts would be blown open by its respective magnetic repulsion member. The magnetic repulsion members for the B and C phases would be unaffected by the operation of the A phase contact assembly. The circuit breaker operating mechanism is used to trip the other two poles in such a situation. This is done to prevent a condition known as single phasing, which can occur for circuit breakers connected to rotational loads, such as motors. In such a situation, unless all phases are tripped, the motor may act as a generator and feed the fault.

In the other automatic mode of operation, the contact assemblies for all three poles are tripped together by a current sensing circuit and a mechanical operating mechanism. More particularly, current transformers are provided within the circuit breaker housing to sense overcurrent conditions. When an overcurrent condition is sensed, the current transformers provide a signal to electronic circuitry which actuates the operating mechanism to cause the contacts to be separated.

Donut-type main current transformers are disposed about load side conductors within the circuit breaker housing to sense overcurrent conditions. The secondary windings of these main current transformers are electrically connected to the primary windings of auxiliary current transformers which step down the current to a lower level. The secondary windings of the auxiliary current transformers are connected to the electronic trip unit.

Connections required between the main current transformers, the auxiliary current transformers and the electronic trip unit are generally done by hand which results in relatively high labor costs.

SUMMARY OF THE INVENTION

It is an object of the present invention to provide means for electrically connecting the main current transformers, the auxiliary current transformers to the electronic trip unit which solves the problems associated with the prior art.

It is yet another object of the present invention to reduce labor costs related to the fabrication of circuit breakers.

Briefly, the invention relates to a multi-purpose combination barrier and auxiliary current transformer board. The board is located at the rear of the circuit breaker housing to close an open portion of the housing and act as a barrier to prevent contact with internal circuit breaker components. Vent holes provided in the bottom portion of the board allow heat generated within the circuit breaker to be exhausted to the atmosphere. The top portion of the board serves as a mounting plate for the auxiliary current transformers. The top portion of the board is formed from a printed circuit board having an electric circuit disposed thereon for the connections between the main current transformers, auxiliary transformers and the electronic trip unit. Connectors are provided on the printed circuit board adjacent each auxiliary current transformer to connect the main current transformers to the printed circuit. Another connector is provided on the board to connect the printed circuit board to the electronic trip unit. Thus, time consuming wiring connections are greatly reduced.

DESCRIPTION OF THE DRAWING

These and other objects and advantages of the present invention will become readily apparent upon consideration of the following detailed description and attached drawing wherein:

FIG. 1 is a plan view of a molded case circuit breaker in accordance with the present invention;

FIG. 3 is a cross-sectional view taken along line 3—3 of FIG. 1 illustrating an outside pole;

FIG. 4 is a cross-sectional view taken along line 4—4 of FIG. 2;

FIG. 5 is a perspective view of a portion of the shock absorber assembly used for outside poles;

FIG. 6 is a cross-sectional view taken along line 6—6 of FIG. 3;

FIG. 7 is a cross-sectional view taken along line 7—7 of FIG. 4;

FIG. 8 is a plan sectional view taken along line 8—8 of FIG. 7;

FIG. 9 is an enlarged cross-sectional view taken along line 9—9 of FIG. 8;

FIG. 10 is an exploded perspective of the cam roller pin assembly;

FIG. 12 is an exploded perspective of the crossbar assembly;

FIG. 13 is a bottom plan view taken along line 13—13 of FIG. 2;

FIG. 14 is a cross-sectional view taken along line 14—14 of FIG. 2;

FIG. 15 is a plan sectional view taken along line 15—15 of FIG. 14;

FIG. 16 is a plan sectional view taken along line 16—16 of FIG. 14;

FIG. 17 is a cross-sectional view taken along line 17—17 of FIG. 1; and

FIG. 18 is an exploded perspective view of the modular option deck assembly.

DETAILED DESCRIPTION

Figure 2:
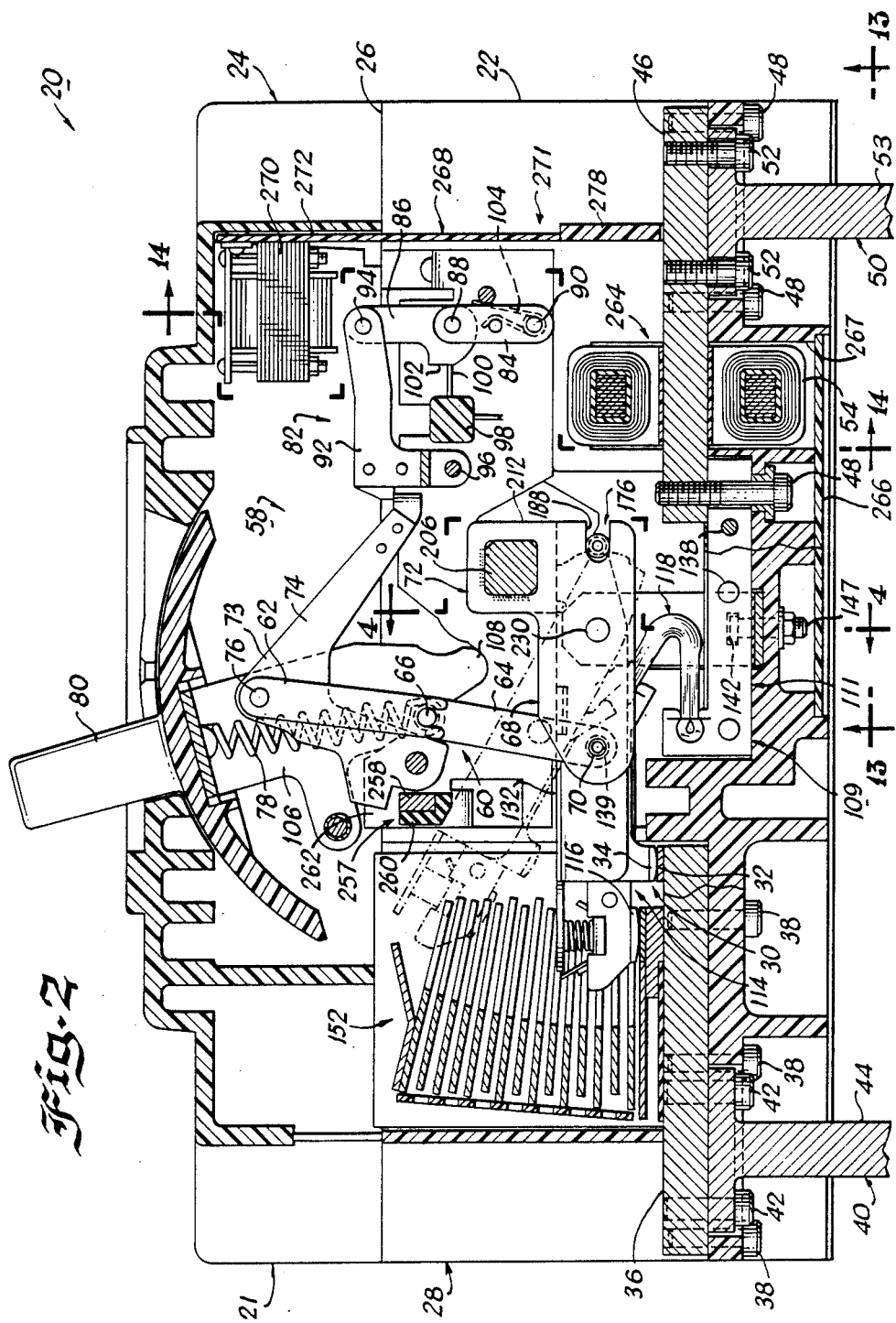
FIG. 2 is a cross-sectional view taken along line 2—2 of FIG. 1.
Figure 11:
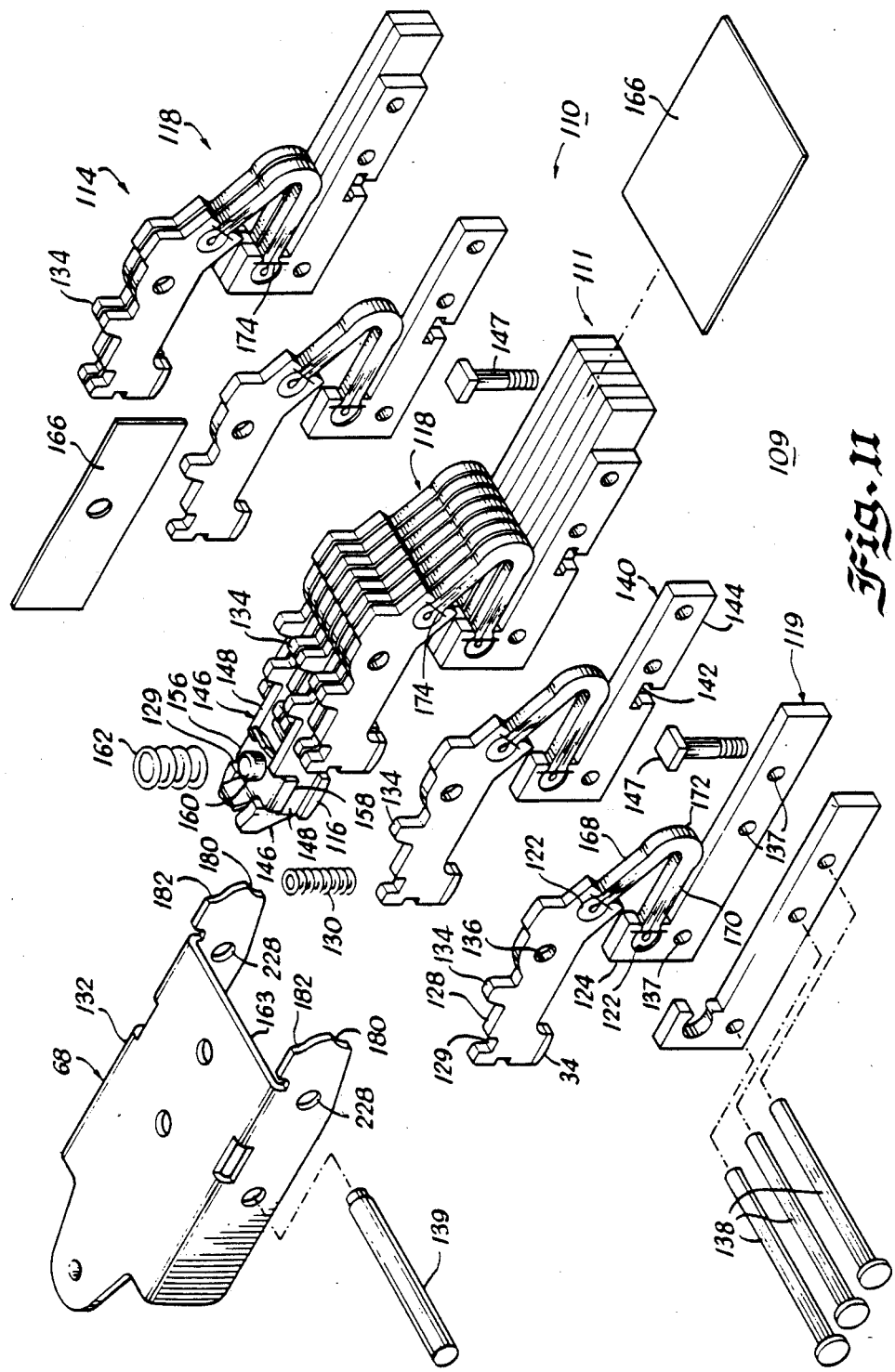
FIG. 11 is an exploded perspective of the laminated copper assembly.

A molded case circuit breaker, generally indicated by the reference numeral 20, comprises an electrically insulated housing 21 having a molded base 22 and a molded coextensive cover 24, assembled at a parting line 26. The internal cavity of the base 22 is formed as a frame 28 for carrying the various components of the circuit breaker. As illustrated and described herein, a Westinghouse Series C, R-frame molded case circuit breaker will be described. However, the principles of the present invention are applicable to various types of molded case circuit breakers.

At least one pair of separable contacts 30 are provided within the housing 21. More specifically, a main pair of contacts 30 are provided which include a fixed main contact 32 and a movable main contact 34. The fixed main contact 32 is electrically connected to a line side conductor 36, bolted to the frame 28 with a plurality of fasteners 38. A T-shaped stab 40 is fastened to the line side conductor 36 with a plurality of fasteners 42. A depending leg 44 of the stab 40 extends outwardly from the rear of the circuit breaker housing 21. This depending leg 44 is adapted to plug into a line side conductor disposed on a panelboard (not shown).

Similarly, the movable main contact 34 is electrically connected to a load side conductor 46 fastened to the frame 28 with a plurality of fasteners 48. Another T-shaped stab 50 is connected to the load side conductor 46 with a plurality of fasteners 52. A depending leg 53 of the stab 50, which extends outwardly from the rear of the circuit breaker housing 21, is adapted to plug into a load side conductor within a panelboard.

A donut-type current transformer (CT) 54 is disposed about the load side conductor 46. This current transformer 54 is used to detect current flowing through the circuit breaker 20 to provide a signal to an electronic trip unit (not shown) to trip the circuit breaker 20 under certain conditions, such as an overload condition. The electronic trip unit is not part of the present invention.

OPERATING MECHANISM

An operating mechanism 58 is provided for opening and closing the main contacts 30. The operating mechanism includes a toggle assembly 60 which includes a pair of upper toggle links 62 and a pair of lower toggle links 64. Each upper toggle link 62 is pivotally connected at one end to a lower toggle link 64 about a pivot point 66. Each of the lower toggle links 64 are pivotally connected to a contact arm carrier 68 at a pivot point 70. The contact arm carrier 68 forms a portion of a crossbar assembly 72. The upper toggle links 62 are each pivotally connected to depending arms 73 of a cradle 74 at a pivot point 76. A biasing spring 78 is connected between the pivot point 66 and an operating handle 80. The biasing spring 78 biases the toggle assembly 60 to cause it to collapse whenever the cradle 74 is unlatched from a latch assembly 82 causing the movable main contacts 34 to rotate about a pivot point 83 to cause the main contacts 30 to separate.

The latch assembly 82 latches the cradle 74 and toggle assembly 60. The latch assembly 82 includes a pair of latch links 84 and 86, pivotally connected end to end at a pivot point 88. The free end of the lower latch link 84 is pivotally connected to the frame 28 about a pivot point 90. The free end of the upper latch link 86 is pivotally connected to a latch lever 92 about a pivot point 94. The other end of the latch lever 92 is pivotally connected to the frame 28 about a pivot point 96.

Operation of the latch assembly 82 is controlled by a trip bar 98 having a depending lever 100 extending outwardly. The depending lever 100 engages a cam surface 102, formed on the pivotally connected end of the upper latch link 86 when the latch assembly 82 is in a latched position. In response to an overcurrent condition, the trip bar 98 is rotated clockwise to move the depending lever 100 away from the latch surface 102. Once the latch lever 92 has cleared the cam surface 102, a biasing spring 104, connected between the lower latch link 84 and the frame 28, causes the lower latch link 84 to toggle to the left causing the latch lever 92 to rotate clockwise thereby releasing the cradle 74. Once the cradle 74 is released from the latch assembly 82, the cradle 74 rotates counterclockwise under the influence of the biasing spring 78. This causes the toggle assembly 60 to collapse which, in turn, causes the main contacts 30 to separate. The circuit is reset by rotating the handle 80 to the CLOSE position. The handle 80 is integrally formed with an inverted U-shaped operating lever 106 which pivots about a pivot point 108.

The trip bar 98 is controlled by an electronic trip unit which actuates a solenoid (not shown) having a reciprocally mounted plunger which engages the lever 100 which, in turn, causes the trip bar 98 to rotate in a clockwise direction to unlatch the latch assembly 82. The electronic trip unit actuates the solenoid in response to an overcurrent condition sensed by the current transformer 54.

LAMINATED CONTACT ASSEMBLY

A laminated contact assembly 109 is formed from a plurality of individual movable main contact assemblies 110. The individual contact assemblies 110 are fastened together to form the laminated contact assembly 109. The individual contact assemblies 110 include an elongated electrical conductor portion 111 and a contact arm portion 114. Some of the contact arm portions 114 carry the movable main contacts 34, while some are used to carry arcing contacts 116. The contact arm portions 114 are coupled to stationary conductor portions 111 by way of repulsion members or flexible shunts 118.

Several different types of individual contact assemblies 110 are used to form the contact assembly 109. In a first type 119, an L-shaped conductor portion 111 is provided having an arcuate slot or keyhole 122 disposed on an edge on a short leg 124 of the L-shaped conductor 111. The keyhole 122 is used to receive an end of the magnetic repulsion member 118. The assembly 110 also includes a contact arm 114 having an irregular shape for carrying either a main movable contact 34 or an arcing contact 116 at one end. Another arcuate slot or keyhole 122, formed in the contact arm portion 114, disposed at an end opposite the main movable contact 34 or the arcing contact 116, is used to receive the other end of the magnetic repulsion member 118. The ends of the magnetic repulsion members 118 are crimped prior to being inserted into the keyholes 122. A top edge 128 of the contact arm portion 114 is formed with a rectangular recess 129 for receiving a biasing spring 130. The other end of the spring 130 seats against a pivotally mounted bracket 132. The top edge 128 of the contact arm portion 114 also includes an integrally formed stop 134. The stop 134 is used to stop movement of the contact arm 114 with respect to the pivotally mounted bracket 132.

The spring 130 exerts a downward pressure or force on the contact arm portion 114 forcing it against the fixed main contact 32. This force may be about 4 to 5 pounds. The contact pressure from the spring 130 in conjunction with the magnetic repulsion forces produced as a result of current flowing in the magnetic repulsion member or shunt 118 controls the withstand rating of the circuit breaker. The withstand rating of a circuit breaker is the current at which the main contacts 30 begin to separate. Since the repulsion force generated by the magnetic repulsion member 118 is a function of the current flow through the magnetic repulsion member 118, the biasing springs 130 are used to oppose that force to control the withstand rating of the circuit breaker in certain conditions.

Each contact arm portion 114 is provided with an aperture 136 for receiving a pin 139 for fastening the contact arm portions 114 together which defines a pivot point for the contact assembly 109. The stationary conductor portion 111 of each of the individual contact assemblies 110 is provided with three spaced-apart apertures 137 for receiving a plurality of rivets or fasteners 138 for fastening the stationary conductor portions 111 together.

An important aspect of the invention relates to the method for connecting the contact assembly 109 to the base 22 of the circuit breaker housing 21. In conventional circuit breakers, the contact assemblies 109 are attached to the base of the circuit breaker by drilling and tapping holes in a base portion of the contact assembly. Fasteners are then screwed into the tapped holes to secure the contact arm assembly to the circuit breaker base. However, in such an arrangement, the tapped holes may become loose over time due to the dynamic forces within the circuit breaker. The present invention solves this problem by providing T-shaped slots in the bottom portion of the contact arm assembly 56 for receiving square-headed bolts which are captured within the assembly 109.

Accordingly, a second type of individual contact assembly 140 is provided having a T-shaped slot 142 formed on a bottom edge 144 of the stationary conductor portion 111. This T-shaped slot 142 is to receive a square-headed bolt, 147. The contact arm portion 114 of the assembly 140, as well as the magnetic repulsion member 118, are similar to those used in the contact assembly 110. Since the contact assemblies 140 with the T-shaped slots are sandwiched between adjacent contact arm assemblies which do not have such a T-shaped slot 142 formed on the bottom edge, the square-headed bolt 112, after assembly, will be captured in the T-shaped slot 142.

In another type of individual contact assembly 146, the stationary conductor portion 111 is similar to that provided with the contact assembly 119. The essential difference between the individual contact assemblies 119 and 146 is that the contact arm portions 114 in the assembly 146 carry arcing contacts 116 instead of main contacts 30 defining an arcing contact arm 148. These arcing contacts 116 extinguish the arc caused when the main contacts 30 are separated. An arc suppression chute 152 is provided within the circuit breaker housing 21 to facilitate extinguishment of the arc. Each of the arcing contact arms 148 are formed with a rectangular recess 129 for receiving a bracket 156 having parallel depending arms 158. The bracket 156 is received in the rectangular recesses 129. The bracket 156 also contains an upwardly-disposed protuberance 160 used to receive a spring 162 disposed between the bracket 160 and the underside 163 of the pivotally mounted bracket 132. The arcing contact arms 148, similar to the main contact arm portions 114, are rotatable about the pivot point 137.

The various types of individual contact assemblies 119, 140 and 146 are stacked together such that the apertures 137 in the L-shaped conductor portions 111 are aligned. Rivets or fasteners 138 are then inserted into the apertures 136 to secure all of the L-shaped conductor portions 111 together. A pin or rivet defining a pivot point 139 is inserted through the apertures 136 in the contact arm portions 114 and arcing contact arms 148 to connect all of the contact arm portions 114 together and to the pivotal bracket 132. Barriers 166 are placed between the stationary conductor portions 111 of the individual contact arm assembly and the shunts 118. Barriers 166 are also provided between the individual contact arm portions 114 and 148. The completed assembly forms the contact assembly 109.

The shunt or magnetic repulsion member 118 is a laminated member, form wound from a continuous, thin strip of an electrical conductive material, such as copper, forming a laminated magnetic repulsion member. The form wound shunt member 118 is formed into a V-shaped member defining a pair of legs 168 and 170. Current flowing through the legs 168 and 170 causes magnetic forces to be generated which repels the legs 168 and 170 apart. Above a certain level of overcurrent (e.g., above the withstand rating), the magnetic repulsion forces developed will be sufficient to blow open the main contacts 30 rather quickly. The biasing springs 130 oppose the magnetic repulsion forces generated by the magnetic repulsion member 118 to allow the current transformer 54 and the electronic trip unit to sense the overcurrent condition and trip or separate the contacts by way of the operating mechanism 58 for overcurrent conditions less than the withstand rating of the circuit breaker.

In order to improve the flexibility of the magnetic repulsion member, an apex portion 172 of the member 118 is coined or deformed into a bulb-like shape is shown best in FIG. 7. The extending legs 168 and 170 of the member 118 are crimped and inserted into the keyholes 122 in the stationary conductor portion 111 and the contact arm portions 114 of the individual main and arcing contact arm assemblies. Once the ends of the shunt legs are inserted into the keyholes 122, the assembly is staked on both sides. The staking process provides a groove 174 in the assemblies adjacent the keyholes 122 to prevent wicking of solder used to secure the shunt legs 168 and 170 to the stationary conductor portions 110 and the contact arm portions 114 or 148.

CAM ROLL PIN ASSEMBLY

The cam roll pin assembly 176 is a dual-purpose assembly used to maintain the force between movable 34 and stationary contacts 32 during certain conditions, and maintain contact separation between these contacts when a blow open occurs until the circuit breaker trips by way of the mechanical operating mechanism 58. During normal operation, when the overcurrent is less than the withstand rating of the circuit breaker 20, a cam roll pin assembly 176 bears against a cam surface 180, integrally formed in the pivotally mounted bracket 132, which forms a portion of the contact arm assembly 109. This couples the crossbar assembly 72 to the contact arm assembly 109. Since the toggle assembly 60 is coupled to the crossbar assembly 72, this will allow the operation of the main contacts 30 to be controlled by the mechanical operating mechanism 58. As heretofore stated, the biasing springs 130 in the contact assembly 109 will cause a downward pressure or force on the movable contact 34 against the fixed main contact 32. For overcurrent conditions less than the withstand rating of the circuit breaker 20, the contact arms 114 and 148 will pivot about an axis 137. During such an overcurrent condition, the magnetic repulsion forces generated by the extending legs 168 and 170 of the magnetic repulsion member 118 will cause the contact arms 114 and 148 to rotate about the axis 139 in a counterclockwise direction forcing the main contacts 30 together to allow the operating mechanism 58 to trip the circuit breaker. In this situation, due to the pivotal movement of the contact arms 114 and 148 about the axis 137, the magnetic repulsion members 118 act to close or "blow on" the main contacts 30.

For overcurrent conditions below the withstand rating of the circuit breaker, the cam roll pin assembly 176 will ride in the cam surface 180 to mechanically couple the contact assembly 109 to the crossbar assembly 72. In this situation, the current transformer 54 will sense an overcurrent condition and provide a signal to an electronic trip unit which will in turn cause the operating mechanism 58 to trip the circuit breaker and open the main contacts 30. However, for a relatively higher overcurrent condition, greater than the withstand rating, the pivot point for the contact arm assemblies 109 will change to allow the contact assemblies 109 to blow open. More specifically, the magnetic repulsion forces generated by the magnetic repulsion member 118 will cause the cam roll pin assembly 176 to move away from the cam surface 180 to a second cam surface 182 to allow the movable contact assembly 109 to pivot about another axis 183. In this situation, the magnetic repulsion forces generated by the magnetic repulsion member blow open the main contacts 30. After blow open, once the cam roll pin assembly 176 reaches the cam surface 182, it will keep the main contacts 30 separated. Otherwise, after the overcurrent condition ceased, there would not be any magnetic repulsion forces to keep the main contacts 30 separated.

There are two points of contact at each end of the cam roll pin assembly 176 of the outside poles. One point of contact 184 is disposed intermediate the end. It is the point where the cam roll pin assembly 176 rides along the cam surfaces 180 and 182 of the pivotally mounted bracket 132. The other point of contact 186 is at the ends of the cam roll pin assembly 176 where it is received within a pair of slots 188 in an electrically-insulated sleeve which forms a portion of the crossbar assembly 72. When a blow open condition occurs, the contact points 184 and 186 may rotate in opposite directions. In such a situation, relatively large torsional and frictional forces are created on the cam roll pin assembly 176 which may cause the blow open speed to be reduced or possibly cause the breaker not to trip after blow open has occurred. In accordance with an important aspect of the present invention, a cam roll pin assembly 176 is provided which has independently rotatable portions for each contact point 184 and 186 at each end to reduce the frictional and torsional forces which may be generated during a blow open condition.

The cam roller pin assembly 176 includes a cylindrical portion 192 having extending axles 194 disposed at each end. A small roller 196 and a large roller 198 are disposed on each axle 194. After the rollers 196 and 198 are placed on the axle 194, a retaining ring 197 is used to secure the rollers 196 and 198 to the axle 194. The small roller 196 is used to engage the cam surfaces 180 and 182 on the pivotally mounted bracket 132 while the larger roller 198 is received within the slot 188 in the electrically insulated sleeve 190. Since individual rollers are used for each of the contact points, supported on a common axle, both rollers are independently rotatable. Thus, in situations where the contact points are forced to rotate in opposite directions, such as during a blow open condition, the frictional forces will be greatly reduced, thus resulting in a smoother action of the circuit breaker 20.

The cam roller pin assembly 176 is coupled to the pin 230 about which the pivotally mounted bracket 132 rotates, by way of a plurality of springs 200. Radial grooves 204 formed in the cylindrical portion 192 of the cam pin roller assembly 176 receive hook shaped ends of the springs 200. Similar type grooves may be formed (not shown) on the pin 139 to receive the other end of the springs 200 to prevent axial movement of the springs 200 to couple the cam roller pin assembly 176 to the pin 230.

CROSSBAR ASSEMBLY

The crossbar assembly 72 is coupled to the contact assemblies 109 for each of the poles by way of cam roll pin assemblies 176. More specifically, the crossbar assembly 72 includes an elongated shaft 206 which may be formed with a rectangular cross section. The elongated shaft 206 is used to support a pair of contact arm carriers 68 coupled to the lower toggle links 64 of the toggle assembly 60. Two contact arm carriers 68 are provided adjacent the center pole in a multipole circuit breaker 20. Each contact arm carrier 68 is generally L-shaped having an aperture 210 in a short leg 212. The aperture 210 is rectangular in shape and slightly larger than the cross sectional area of the shaft 206 such that the contact arm carriers 68 can be slidingly received on the shaft 206 and rotate therewith.

The contact arm carrier 68 is a laminated assembly formed from a pair of L-shaped brackets 214, spaced apart to receive the lower toggle link 64 from the toggle assembly 60. The apertures in the lower toggle links 64 (defining the pivot point 70) are aligned with apertures 215 in the L-shaped members 214. Metal pins 216 are inserted through the apertures to form a pivotable connection between the contact arm carriers 68 and the lower toggle links 64. Insulated sleeves 218 having a generally rectangular cross sectional bore are slidingly received on the ends of the crossbar shaft 206. These insulated sleeves 218 are disposed adjacent the outside poles. Oppositely disposed plates portions 220 and 222 are integrally formed with the insulated sleeve 218 from an electrically insulating material. The plate portions 220 and 222 are disposed on opposite ends of the insulated sleeve 218 and contain a pair of inwardly facing rectangular slots 188. The pair of inwardly facing slots 188 are used to receive the rollers 198 of the cam roll pin 176. The oppositely disposed plate portions 220 and 222 are also provided with a pair of aligned apertures 226. The apertures 226 are aligned with apertures 228 in the pivotal bracket 132. A pin 230 is secured in the apertures to provide a pivotal connection between the rotatable bracket 132 and the integrally formed insulated sleeve assemblies 218.

The spacing between the oppositely disposed plate portions 220 of the insulated sleeves 218 is such that it captures the pivotally mounted bracket 132. Thus, any magnetic repulsion forces generated between the contact arm assemblies due to overcurrent conditions will cause the contact arm assemblies 109 to repel and, in turn, cause the insulated sleeve portions 218 to be forced off the shaft 206. Since the magnetic repulsion forces can cause movement of the contact arm carriers 68 along the shaft 206, these contact arm carriers 68 are welded to the shaft 206. The insulated sleeve assemblies 218 may be either molded on the shaft 206 or molded separated and affixed to the shaft 20 with an adhesive, such as epoxy, and pinned to the shaft 206 by way of one or more metal pins 232 inserted transversely in apertures in the sleeves 218 and the shaft 206 to prevent axial movement of the sleeves 218 with respect to the shaft 206. The metal pins 232 are inserted flush into apertures (not shown) in the insulated sleeves 218 and may be covered with an electrically insulating material.

RUBBER STOPS IN OUTSIDE POLES

A rubber stop assembly 234 is provided on each of the outside poles to prevent damage to the cover 24 of the circuit breaker when the contact assemblies 109 are separated from the fixed main contact 32. During relatively high overcurrent conditions, particularly when the contact arm assembly 109 is blown-open by the magnetic repulsion member 118, considerable force is generated. In conventional circuit breakers shock absorbing materials are glued to the inside of the cover to stop or prevent the contact assembly 109 from striking the cover 24. However, in some circumstances, damage to the cover 24 still results. An important feature of the present invention relates to the rubber stop assemblies 234 for outside poles used to prevent the contact assemblies 109 from striking the cover 24. The rubber stop assembly 234 includes a shock absorber 236, spaced away from the cover 24 of the circuit breaker housing 21. By spacing the shock absorber 236 away from the cover 24, damage to the cover 24 is prevented.

An important aspect of the rubber stop assembly 234 is that it includes a dual purpose bracket 238 with two parallel sets of spaced apart depending arms 240 and 242. The relatively longer set of arms 240 contain aligned apertures 243 at the free end 244 for receiving a pin 246. The shock absorber 236 is generally cylindrical in shape having a center bore with a diameter to allow it to be slidingly received on the pin 246. The pin 246 is slightly longer than the cylindrical shock absorber such that the ends of the pin extends outwardly from the arms 240. This extending portion of the pin is received in an integrally molded bores 248 formed in the frame 28 to provide additional support for the rubber stop assembly 234. The relatively shorter set of extending arms 242 are used to provide a pivotal connection for the crossbar assembly 42.

A bight portion 219 of the bracket 238 is provided with apertures 250. A barrier plate 252 having a pair of extending ears 254 is provided with a pair of apertures 256 which are aligned with the apertures 250 in the bracket 238. The apertures 250 and 256 receive fasteners (not shown) to fasten the rubber stop assembly 234 to the frame of the circuit breaker.

Because the operating mechanism 58, including the toggle assembly 60, is adjacent the center pole, a different rubber stop assembly 257 is used for the center pole. More particularly, an elongated metal bar 258 for carrying a shock absorber 260 is provided. The shock absorber 260 is generally an elongated L-shaped member, secured to the elongated metal bar 258. The length of the elongated metal bar is such that it extends beyond the shock absorber 260 and are received in slots (not shown) in oppositely disposed sideplates 262, disposed adjacent the center pole, rigidly fastened to the frame 28. The mounting of the center pole assembly 257 is such that it is spaced apart from the operating mechanism 58 to prevent the center pole contact assembly 109 from contacting it.

CT QUICK CHANGE ASSEMBLY

The CT quick change assembly 264 allows the main current transformer 54 to be replaced rather quickly and easily either in the factory or in the field. The CT quick change assembly 264 simplifies replacement of the current transformer 54 without requiring extensive dismantling of the circuit breaker. One reason for replacing the current transformer 54 is failure of the current transformer 54. Another reason for replacing the current transformer 54 is the change from one rating to the other rating of a dual rating circuit breaker, such as, in a circuit breaker that has a rating of 1600/2000 amperes. More specifically, a current transformer 54 used with the circuit breaker at the 1600 ampere rating would not be suitable for use at the 2000 ampere rating.

The CT quick change assembly 264 includes the main current transformer 54 disposed about a load side conductor 46 and a removable plate 266. The current transformer 54 is a donut-type current transformer which utilizes the load side conductor 46 as its primary winding.

The main current transformer 54 is disposed in an integrally formed cavity 267 in the frame 28 open on one side to allow removal from the housing 21. The load side conductor is disposed in an integrally formed cavity 269 in the frame 28 to allow the load side conductor 46 to be removed from the housing 21 in a direction parallel to its longitudinal axis. In order to remove the current transformer 54 from the housing 21, the removable plate 266 is removed. After the plate 266 is removed, it is necessary to unscrew six fasteners 48 to uncouple the load side conductor 46. After these bolts are removed, four more fasteners 52 have to be removed to uncouple the stab 50 from the load side conductor 46. Once the stab 50 is uncoupled from the load side conductor 46, the conductor 46 can be slid out in a direction parallel to its longitudinal axis. After the conductor 46 is removed, the current transformer 54 can then be removed from the circuit breaker housing 21 and replaced with a different current transformer. To replace the current transformer 54, the steps are simply reversed. Thus, it should be clear that a quick change CT assembly has been disclosed which allows for a quick and easy replacement of current transformers in the field.

COMBINATION BARRIER AND AUXILIARY CT BOARD

A combination barrier and auxiliary current transformer board 268 is provided. This board 268 has several purposes. One purpose is to provide a barrier to prevent contact with the circuit breaker internal components. More specifically, the board 268 closes an open portion 271 of the housing 21. Another purpose is to provide means for mounting auxiliary transformers 270. A third purpose is to provide a means to connect the auxiliary transformers 270 to the main current transformer 54 and the electronic trip unit. Lastly, the combination barrier and auxiliary CT board 268 provides means for venting of the heat generated within the circuit breaker 20 to the atmosphere.

The combination barrier and auxiliary CT board 268 is comprised of an E-shaped printed circuit board 272. The printed circuit board 272 is received in oppositely disposed slots 274 formed in the side walls 276 of the base 22. The bottom of the printed circuit board 272 rests on top of a vertically standing leg 278 portions of the frame 28. The E-shaped printed circuit board 272 is disposed between the latch assembly 82 and the open portion 271 of the housing 21. The printed circuit board 272 contains a pair of spaced apart slots 282 which define its E-shape. The slots 282 are adapted to receive vertically standing side walls 284 formed in the frame 28.

Three auxiliary transformers 270 are provided; one for each pole. The auxiliary transformers 270 have full primary and full secondary windings and are used to step down the current applied to the electronic trip unit. More specifically, the secondary winding of each of the main current transformers 54 is applied to the primary winding of a corresponding auxiliary current transformer 270. The secondary windings of the auxiliary transformers 270 are then applied to the electronic trip unit.

The printed circuit board 270 is used to replace a wiring harness between the auxiliary transformers 270 and the electronic trip unit. More particularly, an electric circuit is provided on the printed circuit board 272 for the electrical connections required between the primary windings of the auxiliary transformers 270 and the secondary windings of the main current transformer 54. The electric circuit is formed on the printed circuit board 272 in a conventional manner. A main connector 286 is provided in the upper right hand corner of the printed circuit board 272. This connector 286 is electrically connected to the secondary windings of the auxiliary current transformers 270 by way of the electric circuitry formed on the printed circuit board 272. A wiring harness having a connector at both ends (not shown) is then used to connect the printed circuit board 272 to the electronic trip unit. The auxiliary transformers 270 are mounted directly to the printed circuit board 272. Secondary connectors 288 are disposed adjacent each of the auxiliary transformers 270 on the printed circuit board 272. These secondary connectors 288 are connected to the primary windings of the auxiliary transformers 270. In order to connect each of the primary windings of the auxiliary transformers 272 to the secondary windings of the main auxiliary transformers 54, another cable (not shown) is provided having a connector at one end connects the main current transformers 54 to the board 272.

Venting holes 290 are provided in the extending leg portions 292 of the printed circuit board 272. These vent holes allow venting of heat generated in the housing 21 to be vented to the atmosphere.

The combination barrier and auxiliary CT board 268 thus simplifies assembling of a circuit breaker thus reducing manufacturing costs and simplifies the internal wiring of the circuit breaker 20.

MODULAR OPTION DECK ASSEMBLY

A modular option deck assembly is provided which facilitates attachment of various options, such as an undervoltage release mechanism, shunt trip and various other options to the circuit breaker. An undervoltage release mechanism functions to open the main contacts 30 automatically when the line voltage falls below a predetermined value. This is done to prevent certain loads, such as motors, from operating at a reduced voltage which can cause overheating of the motor. An example of an undervoltage release mechanism is disclosed in U.S. Pat. No. 4,489,295, assigned to the same assignee as the present invention and hereby incorporated by reference. A shunt trip device (not shown) is essentially comprised of a solenoid having a reciprocally mounted plunger disposed adjacent the trip bar 98. The shunt trip device allows the circuit breaker 20 to be tripped from a remote location. Neither the undervoltage release mechanism nor the shunt trip device are required for all circuit breakers 20. These items are custom items and are generally factory installed. In order to reduce the manufacturing time and cost of adding such custom items to the circuit breakers 20 during fabrication, an option deck assembly 294 is provided. The option deck assembly 294 includes a rectangular plate disposed under the circuit breaker cover 24 carried by the frame 28 having an aperture 296 to allow communication with the trip bar 98. The plate 294 also includes a plurality of sets of slots 298 for receiving a plurality of downwardly extending L-shaped arms 300 integrally formed with a bracket 302. A plurality sets of slots 298 in the bracket 302 for receiving the arms 300 allow cooperation with the L-shaped arms 300 allow the various options to be secured to the rectangular plate 294 to prevent movement in a direction perpendicular to the plane of the plate 294 and alignment with the trip bar 98. The L-shaped arms 300 are provided on diametrically opposite portions of the bracket 302. A plurality of sets of slots 298 are shown. The bracket 302 is adapted to be received into any set of diametrically opposite slots 304, 306 or 308 to allow up to three options to be provided in a given circuit breaker 20.

The bracket 302 is provided with a plurality of apertures 310 to allow the options to be attached to the bracket 302 by way of a plurality of fasteners (not shown). Grooves 312 are provided in the plate 294, aligned with the apertures 310 in the bracket 302. These grooves 312 provide space for the fasteners used to attach the option to the bracket 302 to allow the bracket 302 to be slidingly received onto the plate 294.

The various options each have a downwardly extending lever (not shown) adapted to engage the trip bar 98 to cause the circuit breaker 20 to trip. After the option is assembled to the bracket 302, the downwardly extending levers extend downwardly from the rear edge of the bracket 302 through the aperture 296 to communicate with the trip bar 98. The brackets 302 are then secured in place. Thus, it should be clear that the option deck assembly allows the customizing of a circuit breaker rather easily and quickly.

Obviously many modifications and variations of the present invention are possible in light of the above teachings. Thus it is to be understood that, within the scope of the appended claims, the invention may be practiced otherwise than as specifically described hereinabove.

What is claimed and desired to be secured by a Letters Patent is:

1. A circuit breaker comprising:
   a housing having a base portion, partially open on one side defining an open portion and a cover portion;
   one or more pairs of separable contacts carried by said housing;
   an operating mechanism operatively coupled to said contacts for actuating said pairs of separable contacts;
   an electronic trip unit mechanically coupled to said operating mechanism for actuating said operating mechanism;
   one or more main current transformers electrically coupled to said electronic trip unit for sensing the current flowing through the circuit breaker;
   one or more auxiliary current transformers electrically coupled to said one or more main current transformers and said electronic trip unit; and
   a board having a barrier portion which closes said open portion to prevent contact with components inside of said circuit breaker, a printed circuit portion having electrical circuitry disposed thereon for electrical connections between said one or more main current transformers and the electronic trip unit and a transformer portion for carrying said one or more auxiliary transformers.

2. A circuit breaker comprising:
   a housing having a base portion and a cover portion said housing partially open on one side defining an open portion;
   one or more pairs of separable contacts;
   an operating mechanism for actuating said pairs of separable contacts;
   an electric trip unit for actuating said operating mechanism;
   a main current transformer coupled to the trip unit for sensing the current flowing through the circuit breaker; and
   a barrier which closes said open portion to prevent contact with components inside of said circuit breaker, said barrier having a surface portion thereof being a printed circuit board and having a electric circuitry disposed thereon with electrical connections between the main current transformer and the electronic trip unit.

* * * * *